United States Patent [19]

Busta

[11] 4,191,057

[45] Mar. 4, 1980

[54] INVERSION LAYER SPRAIN GAUGE

[75] Inventor: Heinz H. Busta, Park Ridge, Ill.

[73] Assignee: Gould Inc.

[21] Appl. No.: 920,137

[22] Filed: Jun. 28, 1978

[51] Int. Cl.² ............................................. G01B 7/16
[52] U.S. Cl. ........................................ 73/777; 357/26
[58] Field of Search ...................... 73/777, 767, 1 B; 357/26

[56] References Cited

U.S. PATENT DOCUMENTS

| | | | |
|---|---|---|---|
| 3,121,337 | 2/1964 | Hollander | 73/777 |
| 3,761,784 | 9/1973 | Jund | 73/777 |
| 4,005,318 | 1/1977 | Claiborne | 357/26 |

Primary Examiner—Anthony V. Ciarlante
Attorney, Agent, or Firm—Phillip H. Mayer; Charles E. Snee, III; Russell E. Baumann

[57] ABSTRACT

A strain gauge element having an elastic beam with field effect transistors deposited on one surface arranged in a Wheatstone bridge so that deformation of the beam produces a proportional imbalance signal across the bridge, and means for applying a gate biasing voltage to the transistors with at least one such voltage being adjustable so that the bridge can be electrically balanced for a null or no load condition.

5 Claims, 3 Drawing Figures

INVERSION LAYER SPRAIN GAUGE

This invention relates generally to inversion layer or field effect transistors and more particularly concerns a strain gauge utilizing FET's.

Electrical resistance strain gauges commonly use a deflectible flexure having resistance elements deposited on or adhered to the flexure and connected in a Wheatstone bridge configuration. One technique is to use metallic resistance elements deposited on a beam whose surface carrying the elements distorts in undulating fashion or as to put alternate legs of the bridge in tension and compression, as described in U.S. Pat. No. 3,341,796 issued to W. Eisele on Sept. 12, 1967.

The art has also recognized that resistors diffused into semiconductor crystals such as silicon can be formed to act as strain sensitive elements. Due to the anisotropic nature of semiconductors, the resistance change due to stress is different in different crystallographic directions. Longitudinal and transverse piezoresistance coefficients for various directions in cubic crystals are given by W. G. Pfann and R. N. Thurston, *Journal of Applied Physics* 32, 2008 (1969).

By proper choice of the crystallographic orientation, it is possible to form a resistive bridge circuit on the surface of a semiconductor in which the resistive elements are oriented so that, upon compression or tension in the surface, the resistance of two bridge elements increases and the resistance of the other two bridge elements decreases, thus forming a fully active bridge circuit. The stress sensitivity (gauge factor) and temperature dependence of resistance of the diffused resistor elements can be adjusted by the type of the diffused impurities and by diffusion parameters such as temperature. This is described in some detail by O. N. Tufte and E. L. Stelzer in the *Journal of Applied Physics* 34, 313 (1963).

A problem with such gauges is the practical one of manufacturing the beam so that under zero, no-load conditions, the bridge is electrically balanced and the excitation or bridge bias voltage produces no imbalance signal. In practice, such diffused type gauges are made by diffusing or ion implanting p-type (positive) impurities such as boron into n-type (negative) silicon, or n-type impurities such as arsenic or phosphorus into p-type silicon. The bridge is then electrically measured for balance and, if necessary as is normal, one or more of the legs are electrically connected with an external resistance to balance the bridge.

The art has long known that p-channel or n-channel metal-oxide-semiconductor field effect transistors can be considered as creating electrical resistance elements between the source and the drain terminals, with the resistance value being a function of bias voltage, gate voltage, channel geometry, properties of the semiconductor, thickness of the gate oxide, and stress.

It is the primary aim of the invention to utilize the characteristics of FET's in a strain gauge element to produce a gauge that is substantially superior in performance to prior diffused type gauges, but which is less expensive to manufacture and embody in a sensing device since the problems inherent in shunting, to balance the bridge, are eliminated.

Another object is to provide a gauge element as described above which permits ready zero balancing of the gauge; that is, the gauge can be easily set to a null or zero reading when the user knows there is no strain load to be measured. A collateral object is to provide a gauge element which can be so balanced externally of the element itself and after it is mounted for use.

A further object is to provide an element of the above character that is an active balance with all of the resistance elements of the bridge being subjected to the same stresses and same temperatures.

Other objects and advantages of the invention will become apparent upon reading the following detailed description and upon reference to the drawing, in which.

While the invention will be described in connection with a preferred embodiment, it will be understood that I do not intend to limit the invention to that embodiment. On the contrary, I intend to cover all alternatives, modifications and equuivalents as may be included within the spirit and scope of the invention as defined by the appended claims.

Turning to the drawings, there is shown a strain gauge element 10 embodying the invention and comprising a flexure, preferably a metallic beam 11, having semiconductor materials 12 adhered to one surface of the beam. In carrying out the invention, the materials 12 define four FET's 13, 14, 15 and 16 coupled as resistance elements in a Wheatstone bridge circuit.

Figure 1:
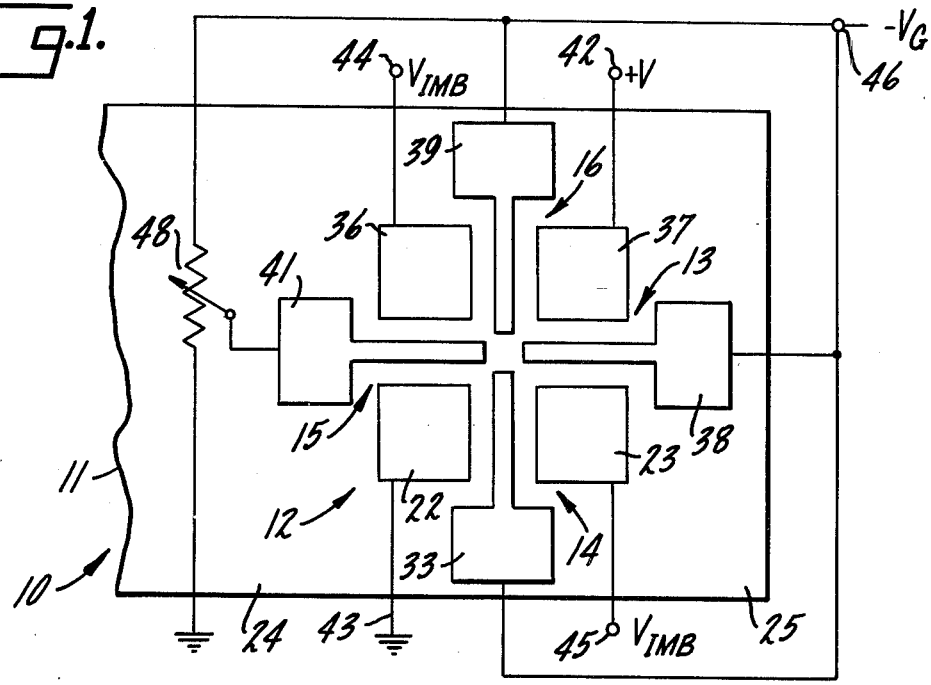
FIG. 1 is a partially schematic plan of a strain gauge element embodying the invention.
Figure 2:
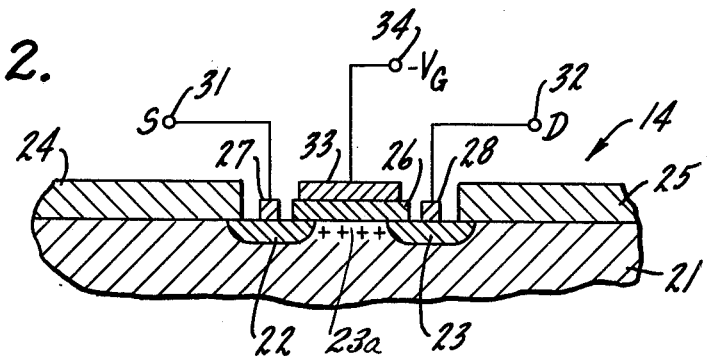
FIG. 2 is an enlarged diagrammatic section of a portion of the element shown in FIG. 1.

Taking the FET 14 as representative (see FIG. 2), it is formed by a layer, comprising one of the materials 12, of one charge-carrier-type silicon 21, such as n-type silicon in this example, bonded on the beam 11. A pair of opposite charge-carrier-type, p-type, silicon regions 22 and 23 are formed by diffusing a p-impurity such as boron into the layer 21, thereby defining a channel 23a of n-type silicon between regions 22 and 23. Layers of silicon oxide 24, 25 and 26 insulate the outer surfaces of the materials 12 except where electrically conductive layers 27 and 28, preferably metal, are deposited on the regions 22, 23 to define connection points for source and drain electrical connections 31 and 32, respectively, of the FET 14. The transistor 14 is completed by an electrically conductive layer 33, coupled to a gate voltage electrical connection 34, which spans channel 23a between the regions 22, 23 and is insulated from the silicon by the silicon oxide layer 26.

The FET 14 is formed so that a negative gate bias voltage applied to the connection 34 permits current to flow from source 31 across channel 23a to drain 32, with the current flow being determined by the effective resistance between the source and drain and that resistance being controlled, for a given source to drain voltage, by the gate voltage. This effective resistance of the FET 14 is also a function of the stress, either compression or tension, in the silicon layers 21, 22, 23, and it is this property that is utilized by the element 10 to reflect strain.

It will be appreciated that a similarly performing complementary FET device can be made by using a p-type silicon base layer, using impurities such as arsenic or phosphorus to form n-type regions corresponding to the regions 22, 23, and applying a positive gate bias voltage.

Figure 3:
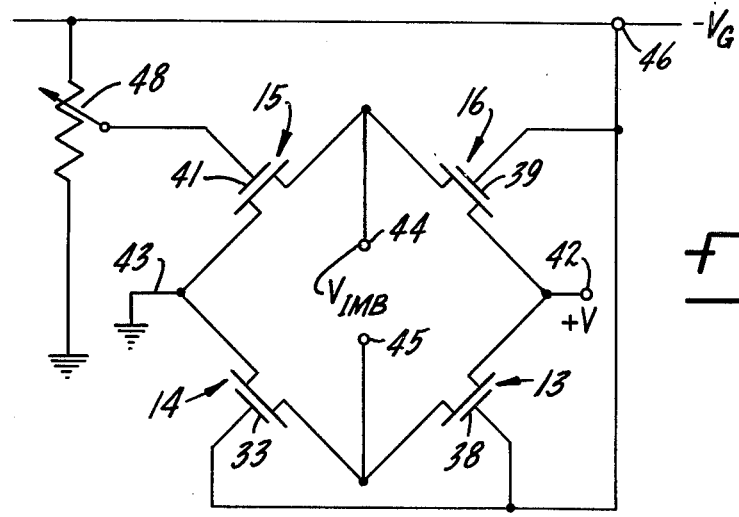
FIG. 3 is a diagram of the circuit embodied in the gauge element of FIG. 1.

Pursuant to the invention, the four FET's 13–16 are formed in an interconnected circuit by utilizing the base silicon layer 21 of one charge-carrier-type silicon for all four FET's and forming the opposite charge-carrier-type silicon in four regions 22, 23, 36 and 37 disposed in a four-corner pattern with each region being equally spaced from two of the other regions, so that channels 23a are formed between the regions, each region thus acting as source or drain or both for two FETs. The electrically conductive layer 33 and three corresponding layers 38, 39 and 41 for the other FET's 13, 16 and 15, respectively, are electrically coupled by a gate bias voltage connection 46 and FET's 13 to 16, respectively, are electrically coupled by a bridge bias voltage connection 42, a ground connection 43, and a pair of voltage imbalance connections 44 and 45 to form a Wheatstone bridge circuit. All of the FET's 13–16 are rendered conductive by gate bias voltages applied to the layers 33, 38, 39, 41 from a source 46. The electrical diagram equivalent of the bridge circuit of the element 10 is shown in FIG. 3.

The orientation of the crystalline structure of the silicon layer 21 is chosen so that stress in the surface of the beam 11 on which the layer 21 is bonded, producing compression or tension in the silicon layer, increases the resistance of one opposite pair of the FET's 13–16 without a change of the gate bias voltage and decreases the resistance of the opposite pair of the FET's at the same gate bias voltage. That is, all the FETs are active in that all respond to applied stress. Thus, deflection of the beam constitutes a measure of stress in whatever causes the beam to deflect, and that deflection causes the resistance of each active FET 13–16 to change when the FET is compressed or tensioned, which produces a voltage at imbalance connections 44,45 which is proportional to the force causing deflection.

In carrying out the invention, at least one gate bias voltage, in this case, the voltage applied to the layer 41, is varied. Changing the gate bias voltage on the FET 15 changes its resistance, and adjusting the resistance of just one leg of a Wheatstone bridge allows the voltage imbalance connections 44, 45 to be brought to a zero potential difference.

Assuming that the product of the resistances of FET's 14 and 16 is smaller than the product of the resistances of FET's 13 and 15, the gate voltage can be adjusted by setting a simple variable resistor 48 so as to reduce the gate voltage of FET 15 and increase its resistance until the resistance products are equal and the bridge is balanced. For production purposes, rather than empirically determining which FET has a lower resistance which can be adjustably increased to balance the bridge, the regions 22, 23, 36 and 37 can be deliberately spaced at slightly non-equidistant positions so that the imbalance is predictable and the gate voltage adjustment applied to the proper FET.

The gauge element 10 can thus be easily set to a null or zero reading when the user knows that that is the proper indication. Those skilled in this art will appreciate that the zero setting capability of the element 10 is substantially more simple than trying to shunt one of the bridge resistances, and the continued capability to adjust permits changes to be made even after the element 10 is installed for its intended use. It will also be apparent that the element 10 can be produced using conventional semiconductor processing and etching techniques.

I claim as my invention:

1. A strain gauge element comprising, in combination: a flexible beam having a layer of one charge-carrier-type silicon; four regions of the opposite charge-carrier-type silicon formed in said layer of said one charge-carrier-type silicon, said regions being disposed in a four corner pattern with each individual region being spaced from two of the other regions to define with said two of the other regions a pair of channels of said one charge-carrier-type silicon; electrically conductive layers deposited on each of said four regions; additional electrically conductive layers deposited on but insulated from said channels between said regions so that each adjacent pair of regions together with its intermediate channel and insulated electrically conductive layer defines a field effect transistor; means electrically coupling said transistors in a Wheatstone bridge circuit so that deformation of said flexible beam produces a proportional imbalance signal in said bridge circuit; and means for applying a gate biasing voltage to each of said insulated electrically conductive layers so as to render said transistors conductive, said voltage applying means permitting at least one gate bias voltage to be varied so as to electrically balance the bridge when there is no strain load.

2. The gauge element of claim 1 in which said one-charge-carrrier-type silicon is n-type silicon; said four regions of silicon are p-type silicon formed by boron diffusion; and said gate biasing voltage is negative.

3. The gauge element of claim 1 in which said one charge-carrier-type silicon is p-type silicon; said four regions of silicon are n-type silicon formed by arsenic or phosphorus diffusion; and said gate biasing voltage is positive.

4. The gauge element of claim 1, wherein at least one of said channels is of different configuration than the remaining channels and said voltage applying means varies the gate bias voltage of said at least one channel.

5. The gauge element of claim 1, wherein each of said transistors is an active element of said bridge.

* * * * *